(12) United States Patent
Tsuda et al.

(10) Patent No.: US 7,586,240 B2
(45) Date of Patent: Sep. 8, 2009

(54) ACOUSTIC WAVE DEVICE

(75) Inventors: Keiji Tsuda, Kanagawa (JP); Jyouji Kimura, Kanagawa (JP); Shunichi Aikawa, Kanagawa (JP); Kazunori Inoue, Kawasaki (JP); Takashi Matsuda, Kawasaki (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 0 days.

(21) Appl. No.: 12/018,460

(22) Filed: Jan. 23, 2008

(65) Prior Publication Data

US 2008/0174207 A1 Jul. 24, 2008

(30) Foreign Application Priority Data

Jan. 23, 2007 (JP) .............................. 2007-012100

(51) Int. Cl.
*H01L 41/08* (2006.01)
(52) U.S. Cl. ...................................... 310/344
(58) Field of Classification Search ................. 310/344, 310/313 R
See application file for complete search history.

(56) References Cited

U.S. PATENT DOCUMENTS

| 5,059,848 | A | * | 10/1991 | Mariani | .................. | 310/313 R |
|---|---|---|---|---|---|---|
| 5,920,142 | A | * | 7/1999 | Onishi et al. | ............. | 310/313 R |
| 6,703,768 | B2 | * | 3/2004 | Kageyama et al. | .......... | 310/344 |
| 7,259,500 | B2 | * | 8/2007 | Iwamoto et al. | ............. | 310/340 |
| 7,427,824 | B2 | * | 9/2008 | Iwamoto et al. | ............. | 310/344 |
| 2004/0251777 | A1 | | 12/2004 | Yamamoto et al. | | |

FOREIGN PATENT DOCUMENTS

| JP | 3196693 | 6/2001 |
|---|---|---|
| JP | 3225906 | 8/2001 |
| JP | 3291046 | 3/2002 |
| JP | 2003-523082 | 7/2003 |
| KR | 10-2004-0079982 A | 9/2004 |
| KR | 10-2005-0034143 A | 4/2005 |

* cited by examiner

*Primary Examiner*—Mark Budd
(74) *Attorney, Agent, or Firm*—Arent Fox LLP.

(57) ABSTRACT

An acoustic wave device includes an acoustic wave element formed on a substrate, a first seal portion provided on the substrate so as to form a cavity above the acoustic wave element, and a second seal portion provided on the first seal portion, the first seal portion having a step so that the first seal portion has a width on a first side and another width on a second side arranged so that the first side is closer than the second side to the substrate, and the width on the first side is greater than the another width on the second side.

9 Claims, 13 Drawing Sheets

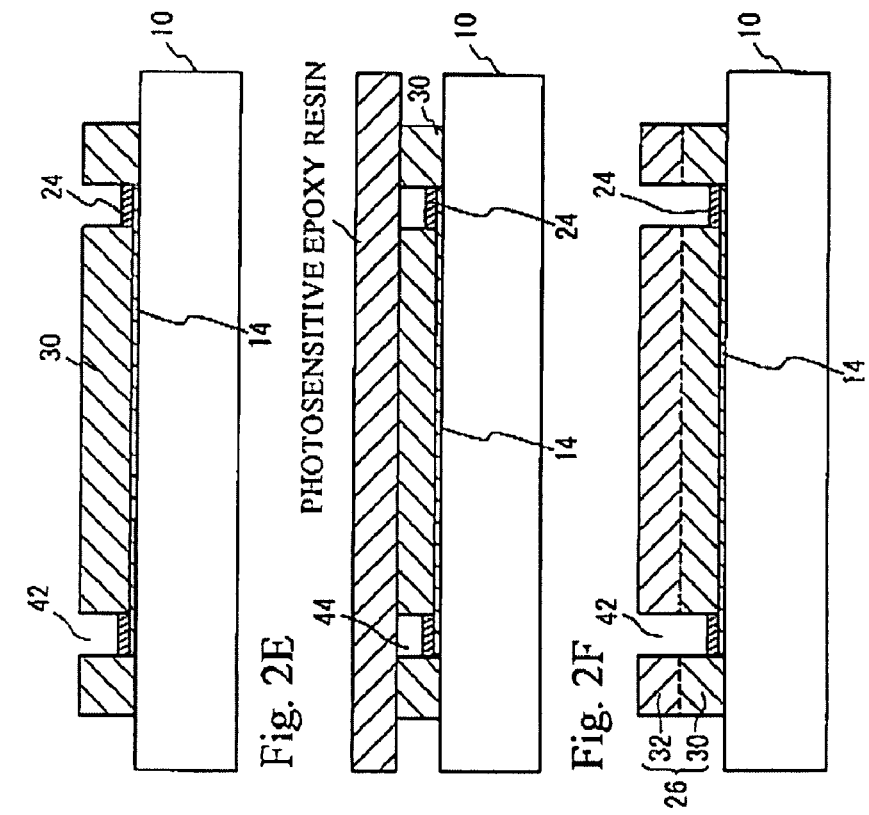

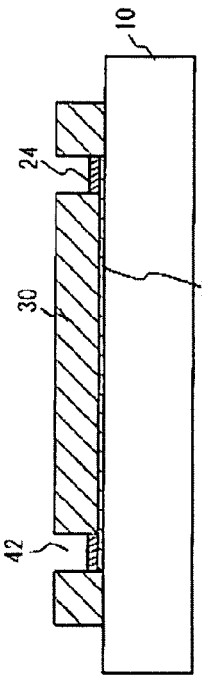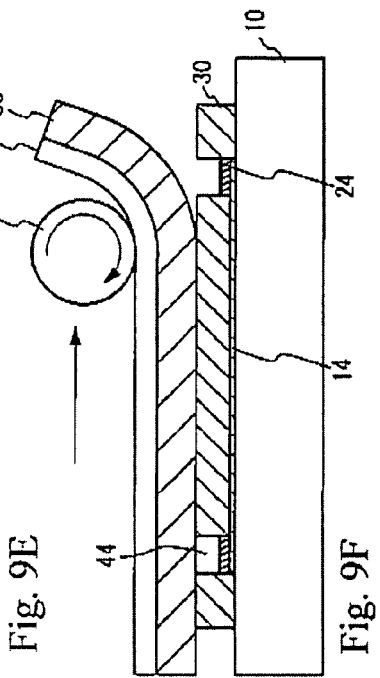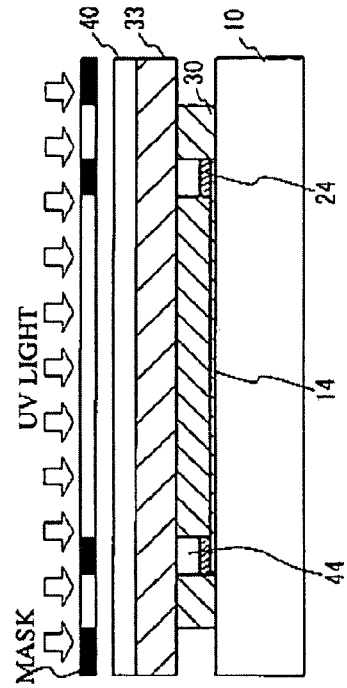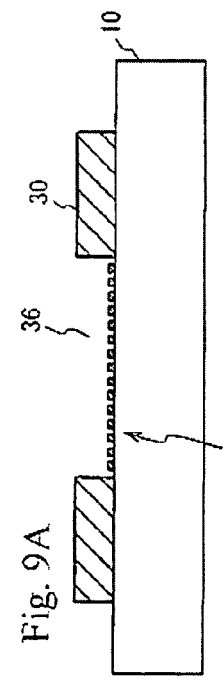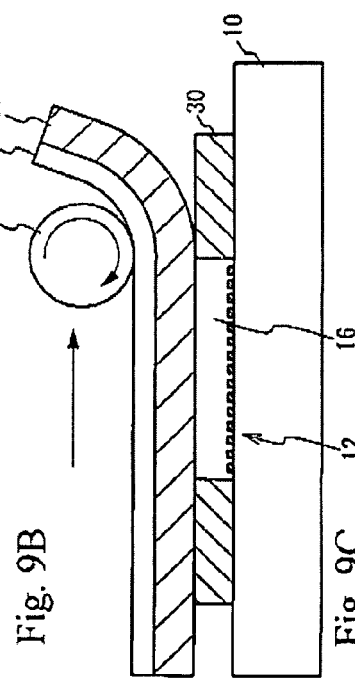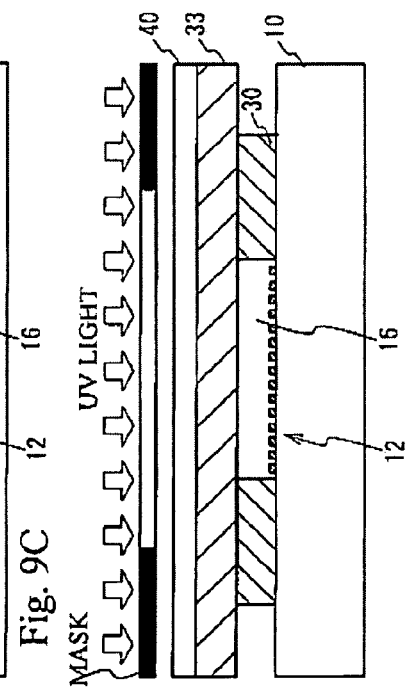

_US 7,586,240 B2_

ACOUSTIC WAVE DEVICE

BACKGROUND OF THE INVENTION

1. Field of the Invention

The present invention generally relates to acoustic wave devices, and more particularly, to an acoustic wave device having a seal portion having a cavity located above an acoustic wave element.

2. Description of the Related Art

A surface acoustic wave device (SAW device) is capable of exciting an acoustic wave by applying power to comb electrodes of an interdigital transducer (IDT) formed on a piezoelectric substrate. The SAW device is widely used for various circuits that process radio signals in a frequency band of for example, 45 MHz to 2 GHz. Examples of these circuits are bandpass filters for transmission, bandpass filters for reception, local oscillation filters, antenna duplexers, intermediate frequency filters, and FM modulators.

Recently, an acoustic wave device using a film bulk acoustic resonator (FBAR) has been developed. The FBAR has a pair of electrodes provided on opposite surfaces of a piezoelectric thin-film and utilizes a vibration in the thickness direction. The acoustic wave device using the FBAR particularly has good performance at higher frequencies and is frequently used in the frequency range of 1 GHz to 10 GHz.

The recent progress in the field of mobile communications is remarkable and needs downsizing of signal processing equipment, which may be realized by miniaturizing electronic components such as acoustic wave devices. In order to realize desired performance of the acoustic wave device, a void space is provided above a functional portion of an acoustic wave element. The functional portion of the acoustic wave element formed by a surface acoustic wave element is the interleaving electrode fingers of the IDT. The functional portion of the acoustic wave element formed by an FBAR is a region in which the upper and lower electrodes face each other across the piezoelectric thin-film.

There are some proposals of using a seal portion having a cavity located above the functional portion of the acoustic wave element in order to meet the above requirements. Japanese Patent No. 3291046 (hereinafter, simply referred to as document D1) proposes to use a soluble resin formed in a region that is to become a cavity above the acoustic wave element. A plate is provided on the soluble resin and is then removed, so that a cavity structure can be realized. Japanese Patent Application Publication No. 2003-523082 (hereinafter, simply referred to as document D2) proposes to form a frame structure that surrounds electric components. An auxiliary film is attached on the frame structure so as to form a cavity above the electric components, and a resin layer is then formed on the auxiliary film. Thereafter, the layers except a roof portion of the frame structure are removed, so that a cavity structure can be realized. Japanese Patent No. 3196693 (hereinafter, simply referred to as document D3) proposes to attach a resin film on a piezoelectric substrate on which acoustic wave elements are formed. Next, an opening is formed in a part of the resin film located above the functional portion of the substrate on which the acoustic wave elements are formed. Then, a circuit board is adhered on the resin film, so that a cavity structure can be realized. Japanese Patent No, 3225906 (hereinafter, simply referred to as document D4) proposes to use a photosensitive resin on a substrate on which acoustic wave elements are provided. Next, openings are formed in the photosensitive resin at positions located above the functional portions of the acoustic wave elements. Then, a substrate formed by a group of wiring boards is mounted on the photosensitive resin. After that, the whole structure is divided into parts by dicing, so that cavity structures can be realized.

However, the acoustic devices formed by the arts disclosed in documents D1 through D4 have a disadvantage that the devices does not withstand pressure applied at the time of modularizing and a ceiling portion of the cavity structure is concaved. The above disadvantage may be removed by thickening the ceiling portion of the cavity structure. However, an increased amount of resin for the purpose of obtaining an increased thickness of the ceiling portion of the cavity structure may degrade the yield.

SUMMARY OF THE INVENTION

The present invention has been made in view of the above circumstance and provides an acoustic wave device having a strengthened structure realized by a high yield.

According to an aspect of the present invention, there is provided an acoustic wave device including: an acoustic wave element formed on a substrate; a first seal portion provided on the substrate so as to form a cavity above the acoustic wave element, and a second seal portion provided on the first seal portion, the first seal portion having a step so that the first seal portion has a width on a first side and another width on a second side arranged so that the first side is closer than the second side to the substrate, and the width on the first side is greater than the another width on the second side.

BRIEF DESCRIPTION OF THE DRAWINGS

FIGS. 2A through 2F are respectively cross-sectional views showing a process for fabricating the acoustic wave device of the first comparative example;

FIGS. 9A through 9F are cross-sectional views showing a subsequent process for fabricating the acoustic wave device in accordance with the first embodiment;

DESCRIPTION OF THE PREFERRED EMBODIMENTS

Figure 1A:
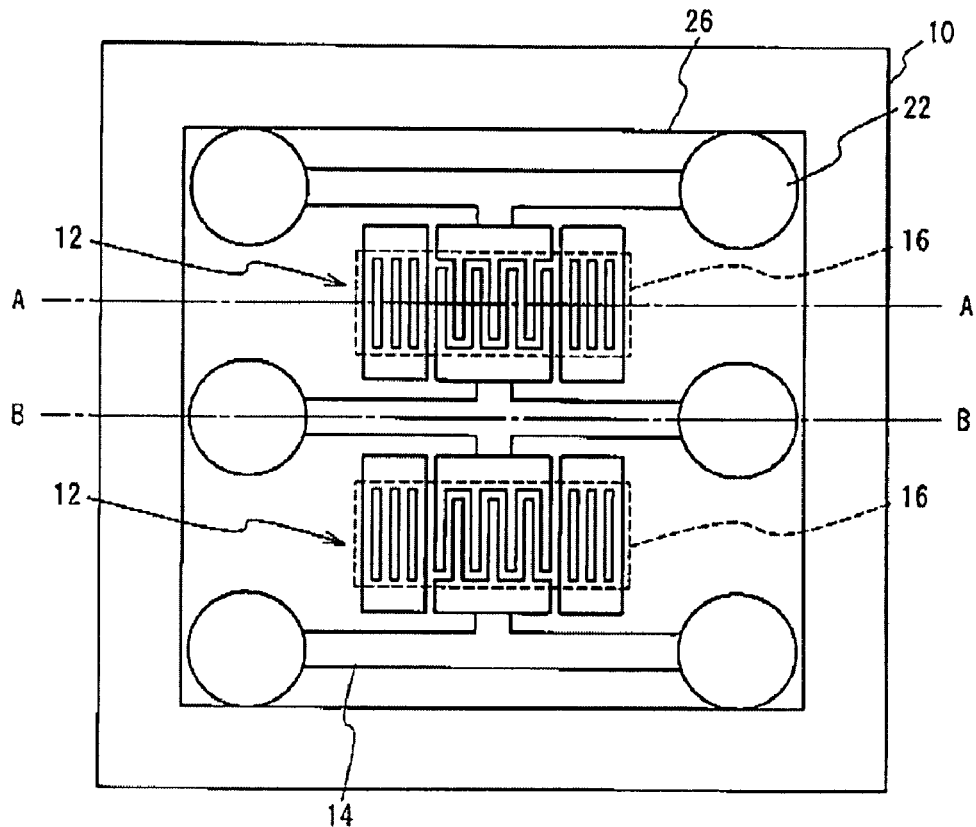
FIG. 1A is a plan view of an acoustic wave device in accordance with a first comparative example.
Figure 1B:
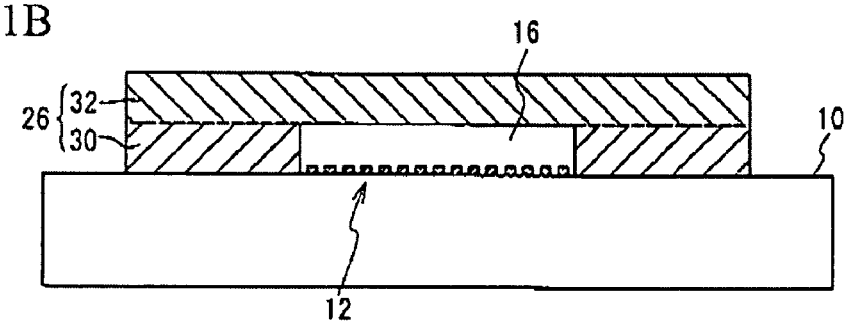
FIG. 1B is a cross-sectional view taken along a line A-A shown in FIG. 1A.
Figure 1C:
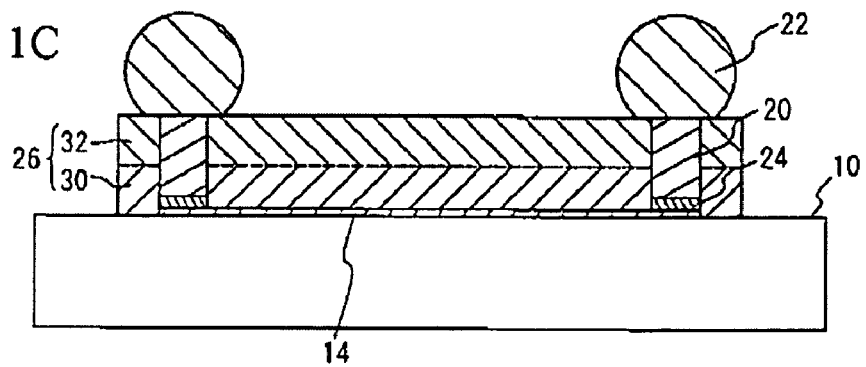
FIG. 1C is a cross-sectional view taken along a line B-B shown in FIG. 1A.

First, a description will be given of an experiment conducted by the inventors for the purpose of making sure the problems of the prior arts described in documents D1 through D4. FIGS. 1A through 1C show an acoustic wave device (first comparative example) having a cavity structure defined by a photosensitive resin. More particularly, FIG. 1A is a plan view of the acoustic wave device, FIG. 1B is a cross-sectional view taken along a line A-A shown in FIG. 1A, and FIG. 1C is a cross-sectional view taken along a line B-B shown in FIG. 1A. In FIG. 1A, there are illustrated an acoustic wave element 12, interconnection lines 14 and cavities 16 seen through a first seal portion 26. The acoustic wave elements 12 and the interconnection lines 14 are illustrated by solid lines, and the cavities are illustrated by broken lines. Referring to FIGS. 1A and 1B, each of the acoustic wave elements 12 includes an IDT and reflectors formed by a metal film on a piezoelectric substrate 10. The first seal portion 26 is provided on the piezoelectric substrate 10 so as to have the cavities 16 located above the functional portions of the acoustic wave elements 12. The first seal portion 26 has a third seal portion 30 and a fourth seal portion 32. The third seal portion 30 is provided on the piezoelectric substrate 10 so as to surround the functional portion of each of the acoustic wave elements 12. The fourth seal portion 32 is provided on the third seal portion 30 so as to define the cavity 16 located above the functional portion of each of the acoustic wave elements 12. For example, the first seal portion 26 may be 60 μm high, and the cavities 16 may be 30 μm high.

Referring to FIGS. 1A and 1C, the interconnection lines 14 and electrode pads 24 are formed on the surface of the piezoelectric substrate 10, and the first seal portion 26 is provided on the interconnection lines 14. Through electrodes 20 that pass through the first seal portion 26 are provided on the electrode pads 24, and the acoustic wave elements 12 and the through electrodes 20 are electrically connected by the interconnection lines 14 and the electrode pads 24 provided thereon. Solder balls 22 are provided on the through electrodes 20. The through electrodes 20 and the solder balls 22 serve as terminals for making electric connections of the acoustic wave elements 12 with the outside when the acoustic wave device is surface mounted. The acoustic wave elements 12 are sealed with the first seal portions 26 having the cavity structures, and are connected to the solder balls 22 via the interconnection lines 14 and the through electrodes 20.

A description will now be given of a process for forming the first seal portion 26 of the acoustic wave device of the first comparative example with reference to FIGS. 2A through 2F. FIGS. 2A through 2C are respectively cross-sectional views taken along a line that corresponds to the line A-A shown in FIG. 1A, and FIGS. 2D through 2F are respectively cross-sectional views taken along another line that corresponds to the line B-B shown in FIG. 1A. Referring to FIGS. 2A and 2D, negative-type photosensitive epoxy resin is coated on the piezoelectric substrate 10 so as to have a thickness of 30 μm by spin coating. At this time, the acoustic wave elements 12, the interconnection lines 14 and the electrode pads 24 are already formed on the piezoelectric substrate 10. Then, the epoxy resin layer is dried. Then, the epoxy resin is exposed and developed, so that only the epoxy resin on the acoustic wave elements 12 and the electrode pads 24 are removed, so that an opening 36 is formed above the functional portion of each of the acoustic wave elements 12 and an opening 42 is formed above each of the electrode pads 24. The third seal portion 30 is formed so as to surround the functional portions of the acoustic wave elements 12. The piezoelectric substrate 10 is heat-treated in a nitrogen atmosphere for about one hour at a temperature of about 200° C., and the third seal portion 30 is thus cured.

Referring to FIGS. 2B and 2E, a negative-type photosensitive epoxy resin film having a thickness of 30 μm is laminated by a laminating method so as to cover the openings 36 and 42. The film covers the functional portions of the acoustic wave elements 12 and shapes the openings 36 into the cavities 16 and the openings 42 into cavities 44. Referring, to FIGS. 2C and 2F, the film is exposed and developed, so that the fourth seal portion 32 can be defined on the third seal portion 30 so as to form the cavities 16 above the functional portions of the acoustic wave elements 12. Further, the openings 42 for the formation of the through electrodes 20 are formed on the electrode pads 24. Further, the piezoelectric substrate 10 is heated in a nitrogen atmosphere for about one hour at a temperature of about 200° C., and the fourth seal portion 32 is thus cured. Through the above-mentioned production steps, the first seal portion 26 of the acoustic wave device in accordance with the first comparative example is completed.

The acoustic wave device of the first comparative example thus formed was mounted on a module substrate and resin for surface protection was transfer-molded. The inventors found out that a ceiling portion of the cavity structure thus processed is concaved and the first seal portion 26 contacts the functional portions of the acoustic wave elements 12.

Figure 3:
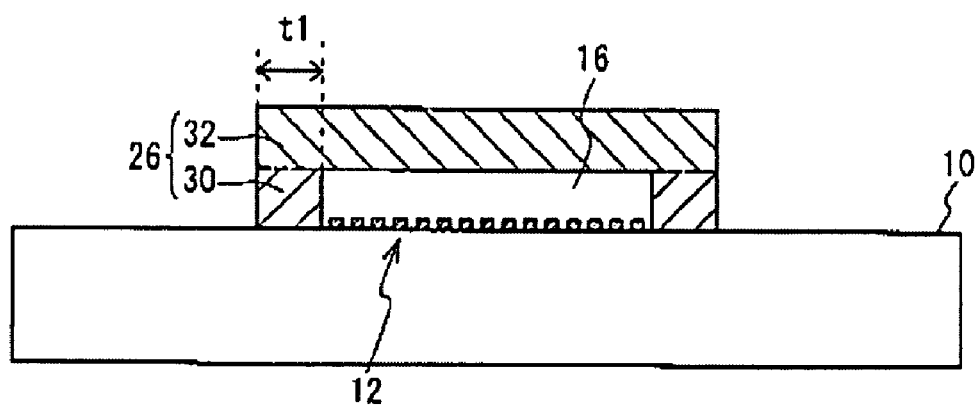
FIG. 3 is a cross-sectional view of an acoustic wave device in accordance with a second comparative example.

The inventors produced an acoustic wave device (now referred to as a second comparative example) shown in FIG. 3 in which the third seal portion 30 is narrower than that of the first comparative example. FIG. 3 is a cross-sectional view of the second comparative example taking along a line that corresponds to the line A-A shown in FIG. 1A. Referring to FIG. 3, the second comparative example has the third seal portion 30 having a thickness t1 equal to 30 μm. The other structure of the second comparative example is the same as that of the first comparative example shown in FIGS. 1A through 1C.

The third seal portion 30 of the acoustic wave device of the second comparative example has the thickness t1 as small as 30 μm. This reduces the area of the contact between the third seal portion 30 and the fourth seal portion 32. The inventors found out the following. The reduced contact area may cause an insufficient adhesiveness between the third seal portion 30 and the fourth seal portion 32. This causes a developer used for forming the fourth seal portion 32 to enter into the cavity structure through the interface between the third seal portion 30 and the fourth seal portion 32. Thus, the functional portions of the acoustic wave elements 12 may be contaminated by the developer, and faulty performance may be caused.

Figure 4:
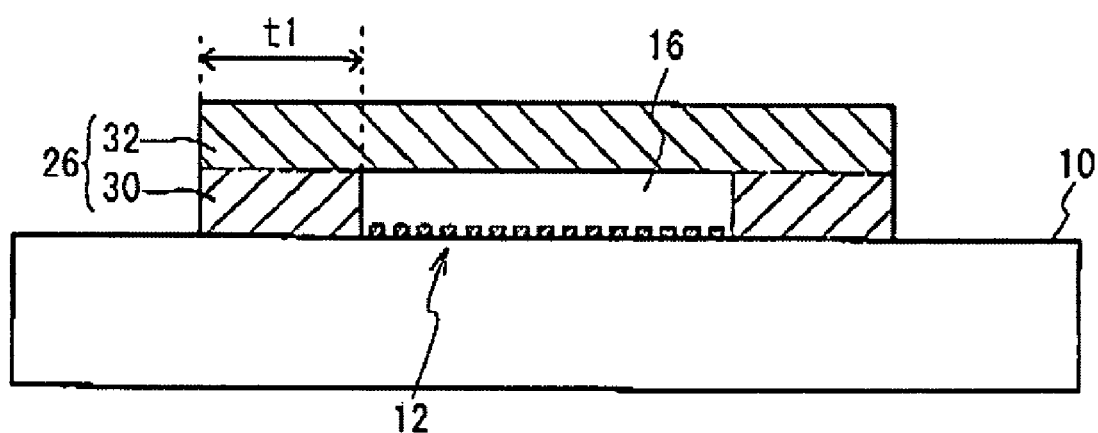
FIG. 4 is a cross-sectional view of an acoustic wave device in accordance with a third comparative example.

It can be seen from the second comparative example that the contact area between the third seal portion 30 and the fourth seal portion 32 is sufficiently large. FIG. 4 is a cross-sectional view of an acoustic wave device in accordance with a third comparative example in which the third seal portion 30 and the fourth seal portion 32 have an increased contact area. The thickness t1 of the seal portion 30 of the third comparative example is 80 μm. The other structure of the third comparative example is the same as that of the first comparative example shown in FIGS. 1A through 1C.

Figure 5:
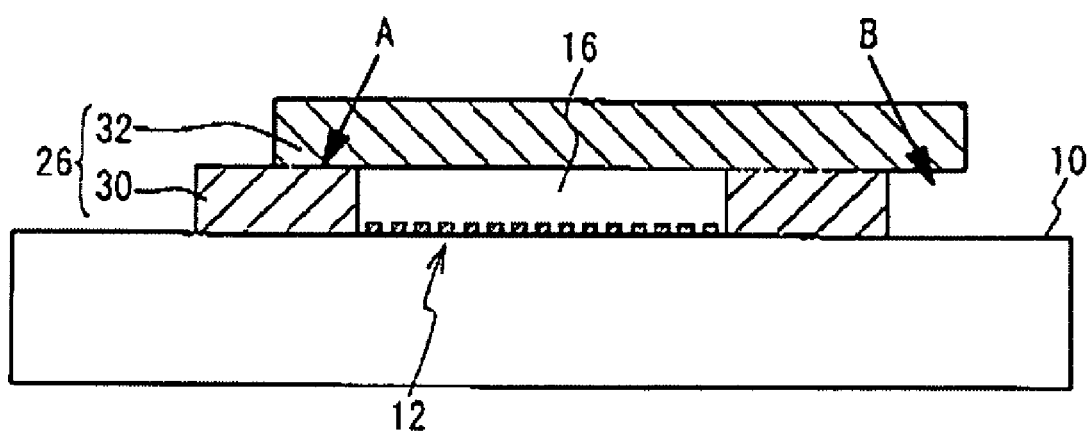
FIG. 5 is a diagram showing problems caused by a wafer warp.

The third comparative example has a larger contact area of the third seal portion within the wafer of the piezoelectric substrate 10 than the second comparative example. Compressive stress applied to the third seal portion 30 of the third comparative example due to the thermal process for forming the third seal portion 30 shown in FIGS. 2A and 2D is greater than that of the second comparative example. Thus, the third comparative example has a greater warp than the second comparative example. When the piezoelectric substrate 10 is a cinch wafer, the warp is 2.5 mm at maximum. When the exposure process for forming the fourth seal portion 32 shown in FIG. 2C is applied to the warped wafer, ultraviolet light (UV light) is obliquely projected onto the wafer in the outer portion of the wafer that has a comparatively great warp. Thus, as shown in FIG. 5, the pattern of the fourth seal portion 32 deviates from that of the third seal portion 30. This deviation of the pattern of the fourth seal portion 32 becomes greater towards the edge of the wafer because the wafer is more greatly warped closer to the edge.

As shown in FIG. 5, the acoustic wave device in which the pattern of the fourth seal portion 32 deviates from that of the third seal portion 30 has a small contact area A between the third seal portion 30 and the fourth seal portion 32. Thus, as has been described in connection with the second comparative example, the developer enters into the cavity structures during the developing process for forming the fourth seal portion 32 and may contaminate the functional portions of the acoustic wave elements 12 (composed of electrode fingers of IDT). This contamination may cause faulty performance. In the 4-inch wafer, the developer does not enter into the cavity structures within a range up to 90 mm from the center of the wafer, within which good performance is available.

Figure 6:
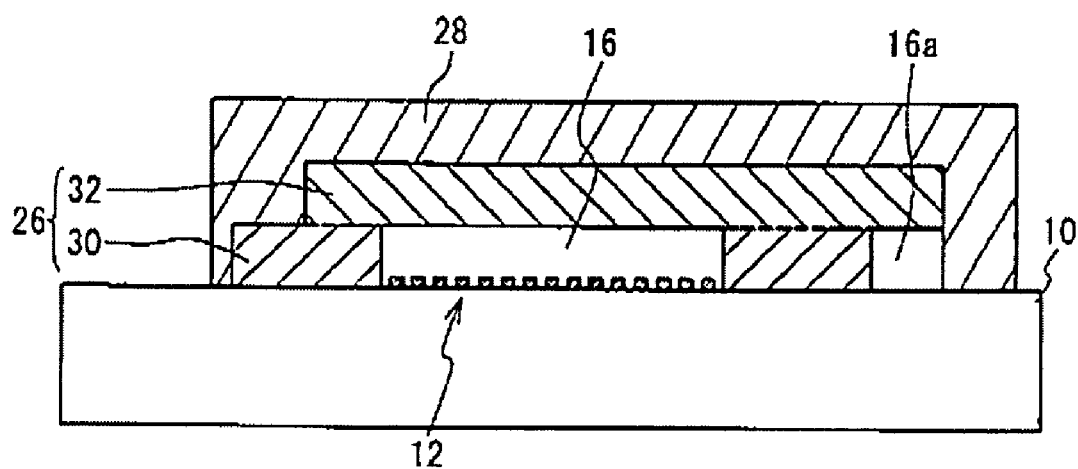
FIG. 6 is another diagram showing problems caused by a wafer warp.

As shown in FIG. 5, the positional deviation of the pattern of the fourth seal portion 32 from that of the third seal portion 30 defines a region B in which the fourth seal portion 32 overhangs. When the second seal portion 28 is formed on the first seal portion 26 for the purpose of reinforcing the first seal portion 26 to prevent the ceiling portion of the cavity structure from being concaved due to pressure applied during modularizing, ultraviolet light for exposure is not projected in the overhang region B. Thus, a cavity 16a is formed after development, as shown in FIG. 6. The cavity 16a reduces the contact area between the second seal portion 28 and the piezoelectric substrate 10, and degrades the adhesiveness between the second seal portion 28 and the piezoelectric substrate 10. This may cause the second seal portion 28 to be removed from the piezoelectric substrate 10. In the 4-inch wafer, the second seal portion 28 is not removed from the piezoelectric substrate 10 within a range up to 70 mm from the center of the wafer, within which good performance is available. As described above, the second seal portion 28 formed on the first seal portion 26 degrades the yield.

The following embodiments of the present invention are capable of solving the above-mentioned problems.

First Embodiment

Figure 7A:
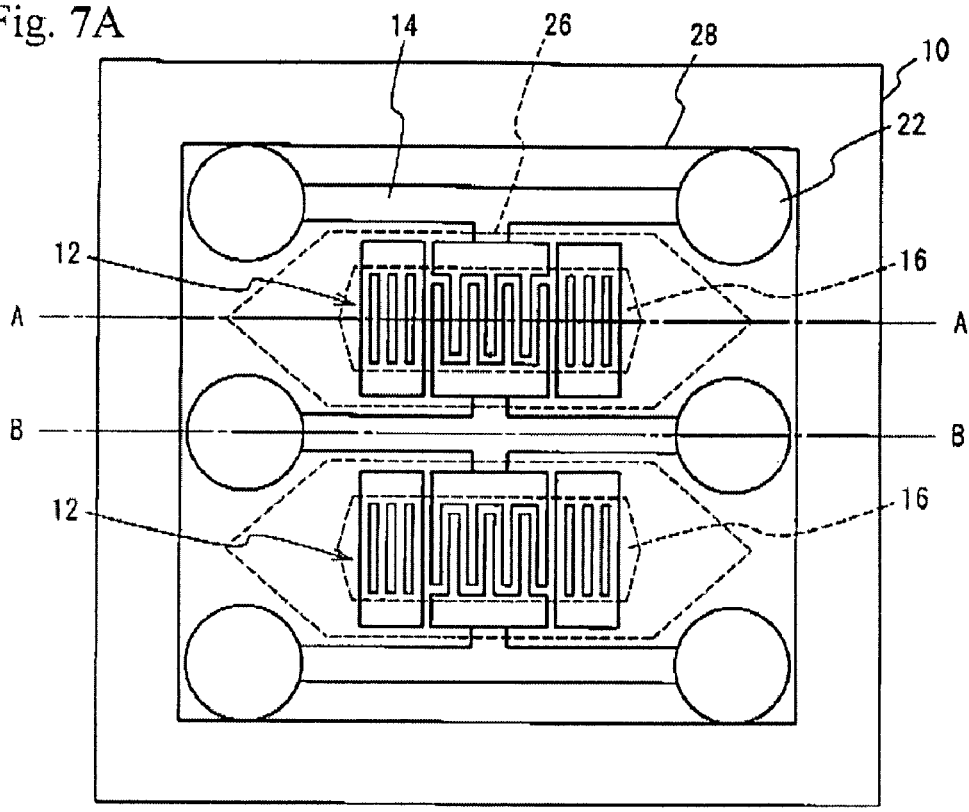
FIG. 7A is a plan view of an acoustic wave device in accordance with a first embodiment.
Figure 7B:
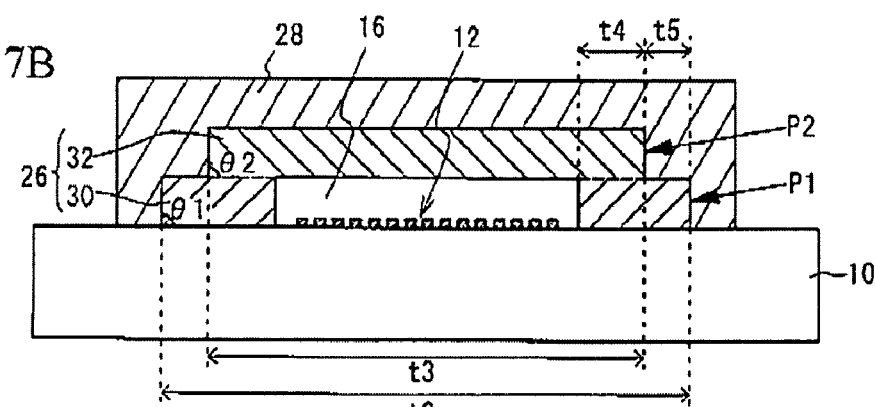
FIG. 7B is a cross-sectional view taken along a line A-A shown in FIG. 7A.
Figure 7C:
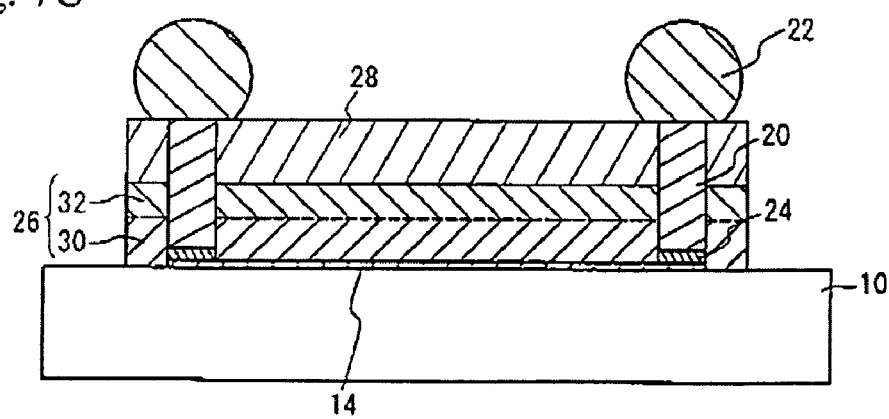
FIG. 7C is a cross-sectional view taken along a line B-B shown in FIG. 7A.

FIG. 7A is a plan view of an acoustic wave device in accordance with a first embodiment. FIG. 7B is a cross-sectional view taken along a line A-A shown in FIG. 7A, and FIG. 7C is a cross-sectional view taken along a line B-B shown in FIG. 7A. In FIG. 7A, there are illustrated the acoustic wave elements 12, the interconnection lines 14 and the cavities 16 seen through the first seal portion 26 and the second seal portion 28. The acoustic wave elements 12 and the interconnection lines 14 are illustrated by solid lines, and the cavities 16 and the first seal portion 26 are illustrated by broken lines.

Referring to FIGS. 7A and 7B, each of the acoustic wave element 12 includes an IDT and reflectors formed by a metal film on the piezoelectric substrate 10. The first seal portion 26 is provided on the piezoelectric substrate 10 so as to have the cavities 16 located above the functional portions of the acoustic wave elements 12. The first seal portion 26 has the third seal portion 30 and the fourth seal portion 32. The third seal portion 30 is provided on the piezoelectric substrate 10 so as to surround the functional portion of each of the acoustic wave elements 12. The fourth seal portion 32 is provided on the third seal portion 30 so as to define the cavity 16 located above the functional portion of each of the acoustic wave elements 12. The third seal portion 30 is wider than the fourth seal portion 32 so that the third seal portion 30 and the fourth seal portion 32 define a step, which may have a stair shape. Side surfaces P1 of the third seal portion 30 laterally protrude from side surfaces P2 of the fourth seal portion 32 so that the step can be formed. The first seal portion 26 has a step in which a width t2 of a lower portion of the first seal portion 26 closer to the piezoelectric substrate 10 is greater than a width t3 of an upper portion thereof farther than the lower portion from the piezoelectric substrate 10. The angles θ1 formed by the side surfaces of the third seal portion 30 and the surface of the piezoelectric substrate 10 may be 90 degrees. The angles θ2 formed by the side surfaces of the fourth seal portion 32 and the surface of the third seal portion 30 may be 90 degrees. The surface of the third seal portion 30 that contacts the fourth seal portion 32 is flat. The second seal portion 28 is provided on the first seal portion 26. The third seal portion 30 may be 30 μm high, the fourth seal portion 32 may be 30 μm high, and the second seal portion 28 may be 30 μm high. The width t4 of the contact area between the third seal portion 30 and the fourth seal portion 32 is equal to or greater than 40 μm, and the width t5 of the third seal portion 30 that does not contact the fourth seal portion 32 is equal to or less than 30 μm.

Referring to FIGS. 7A and 7C, the interconnection lines 14 and the electrode pads 24 are formed on the surface of the piezoelectric substrate 10, and the first seal portion 26 and the second seal portion 28 are provided on the interconnection lines 14. The through electrodes 20, which pass through the first seal portion 26 and the second seal portion 28, are provided on the electrode pads 24. The acoustic wave elements 12 and the through electrodes 20 are connected by the interconnection lines 14 and the electrode pads 24 provided on the interconnection lines 14. The solder balls 22 are provided on the through electrodes 20. The through electrodes 20 and the solder balls 22 serve as terminals for making external electric connections with the acoustic wave elements 12 when the acoustic wave device is surface mounted.

A description will now be given of a method for fabricating the acoustic wave device in accordance with the first embodiment with reference to FIGS. 8A through 11F. FIGS. 8A through 8C, FIGS. 9A through 9C, FIG. 10A through 10C, and FIGS. 11A through 11C are respectively cross-sectional views taken along a line that corresponds to the line A-A shown in FIG. 7A. FIGS. 8D through 8F, FIGS. 9D through 9F, FIGS. 10D through 10F, and FIGS. 11D through 11F are respectively cross-sectional views taken along a line that corresponds to the line B-B shown in FIG. 7A. FIGS. 8A through 11F are fabrication steps that use a wafer from which multiple piezoelectric substrates 10 are shaped. For the sake of simplicity, only one of the piezoelectric substrate 10 will be illustrated and described in the following. In FIGS. 11C and 11F, the wafer on which the multiple acoustic wave devices are integrally formed is diced along peripheries of the devices and is thus divided into the separate acoustic wave devices.

Figure 8A:
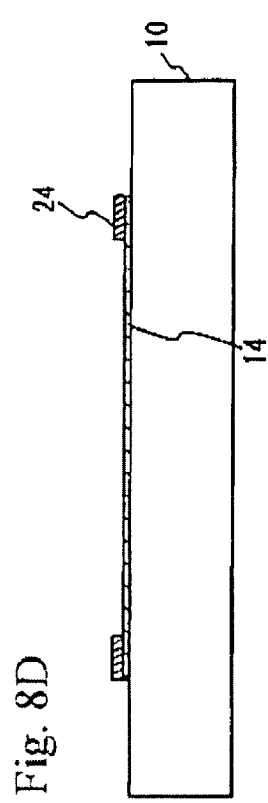
FIGS. 8A through 8F are cross-sectional views showing a process for fabricating the acoustic wave device in accordance with the first embodiment.
Figure 8B:
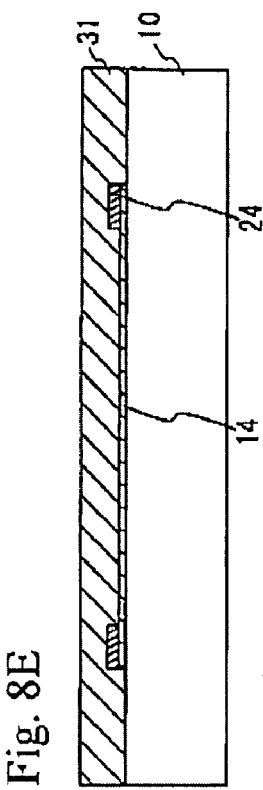
Figure 8C:
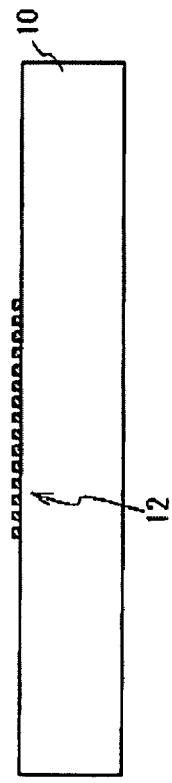
Figure 8D:
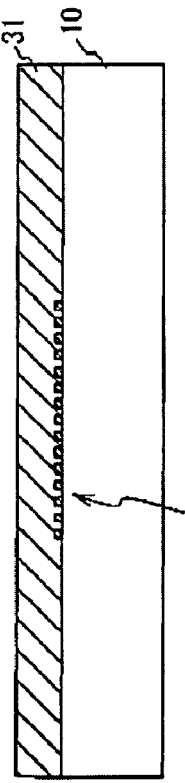
Figure 8E:
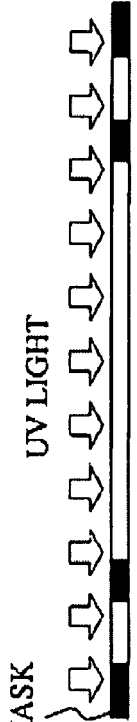
Figure 8F:
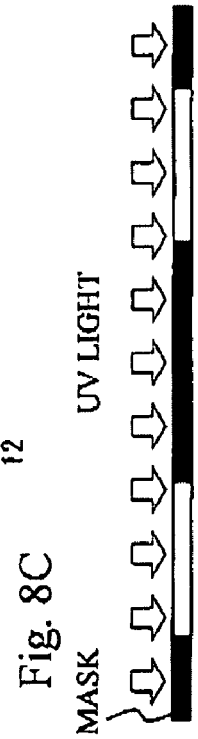

Referring to FIGS. 8A and 8D, a metal film made of, for example, Al (aluminum) or Cu (copper) is formed on the surface of the piezoelectric substrate 10, which may be made of lithium niobate ($LiNbO_3$) or lithium tantalate ($LiTaO_3$) and is formed into the acoustic wave element 12 and the interconnection lines 14. The electrode pads 24 are formed on the interconnection lines 14 in areas in which the through electrodes 20 are to be formed. Referring to FIGS. 8B and 8E, a first resin film 31, which may be made of negative-type photosensitive epoxy resin and may be 30 μm thick, is formed on the piezoelectric substrate 10, the acoustic wave element 12 and the interconnection lines 14 by spin coating, and is then baked. Referring to FIGS. 5C and 8P, a mask is used and ultraviolet light is projected onto the first resin film 31 except an area in which the cavity 16 located above the functional portion of the acoustic wave element 12 is to be formed, areas in which the through electrodes 20 on the electrode pads 24 are to be formed and peripheral areas.

Referring to FIGS. 9A and 9D, the first resin film 31 is developed and is thus removed in the areas onto which the ultraviolet light is not projected. Thus, the opening 36 is defined at a position in which the cavity 16 located above the functional portion of the acoustic wave element 12 is to be formed, and the third seal portion 30 is formed around the functional portion of the acoustic wave element 12. Further, the opening 42 is formed on the electrode pad 24. The wafer is heat-treated in a nitrogen atmosphere for one hour at 200° C., so that the third seal portion 30 is cured. Referring to FIGS. 9B and 9E, a second resin film 33 is depressed on the third seal portion 30 and is laminated thereon by a press roll 38 such as a laminator. The second resin film 33 may be a negative-type photosensitive epoxy resin film coated on a protection film 40, and may be 30 μm thick. The second resin film 33 covers the functional portion of the acoustic wave element 12, and shapes the opening 36 into the cavity 16 and the opening 42 into the cavity 44. Referring to FIGS. 9C and 9F, a mask is used and ultraviolet light is projected.

Figure 10A:
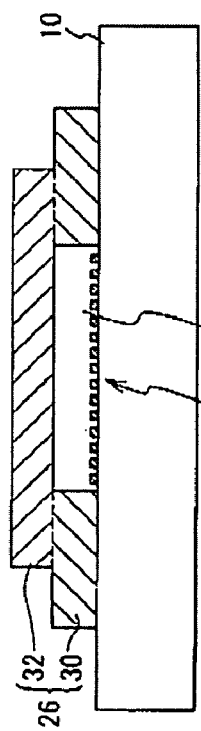
FIGS. 10A through 10F are cross-sectional views showing a yet subsequent process for fabricating the acoustic wave device in accordance with the first embodiment.
Figure 10B:
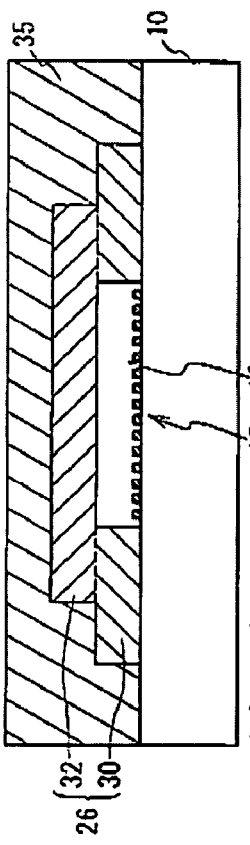
Figure 10C:
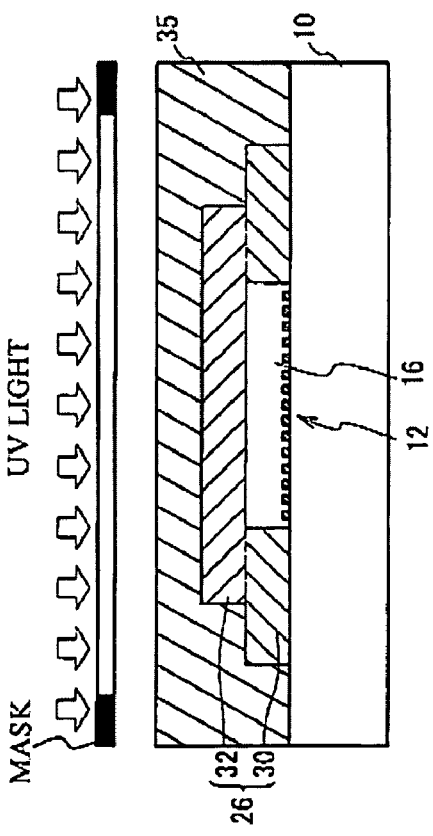
Figure 10D:
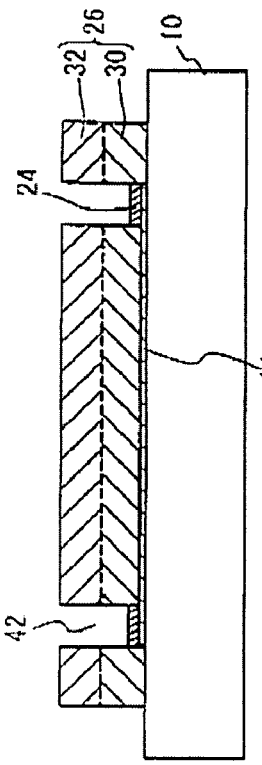
Figure 10E:
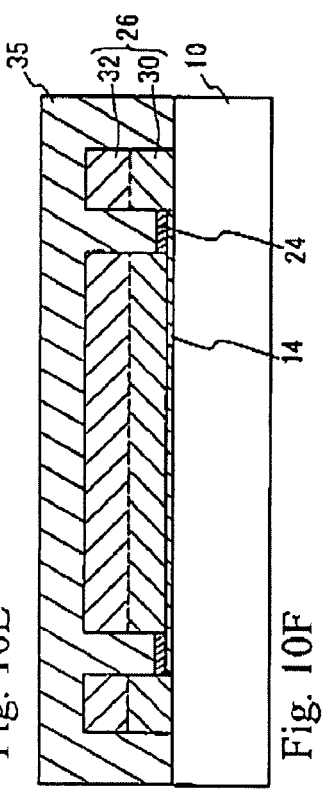
Figure 10F:
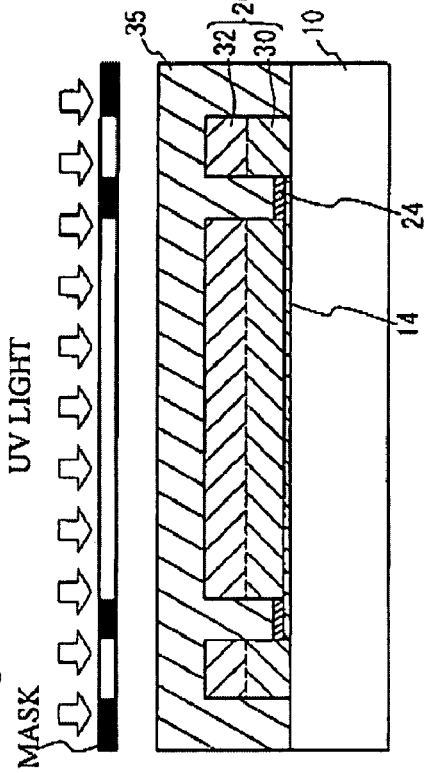

Referring to FIGS. 10A and 10D, the protection film 40 is removed and the wafer is developed to the second resin film 33 can be removed from the areas onto which the ultraviolet light is not projected. Thus, the fourth seal portion 32 is formed on the third seal portion 30 so that the cavity 16 ran be formed above the functional portion of the acoustic wave element 12. The opening 42 is formed on the electrode pad 24. The fourth seal portion 32 is cured by heat-treating the wafer in a nitrogen atmosphere for one hour at 200° C. Thus, the first seal portion 26 is formed. The first seal portion 26 is composed of the third seal portion 30 and the fourth seal portion 32 and is equipped with the cavity 16 located above the acoustic wave element 12. The first seal portion 26 has the step defined by the arrangement in which the width 12 of the first seal portion 26 closer to the piezoelectric substrate 10 is greater than the width t3 farther from the piezoelectric substrate 10. Referring to FIGS. 10B and 10E, a third resin film 35, which may be negative-type photosensitive epoxy resin and may be 30 μm thick, is formed so as to cover the first seal portion 26. The third resin film 35 may be formed by using a film by a vacuum laminate or vacuum press method. The third resin film 35 may be formed by processing a liquid by spin coating. Referring to FIGS. 10C and 10F, ultraviolet light is projected onto the wafer with a mask except the areas above the electrode pad 24 and peripheral areas.

Figure 11A:
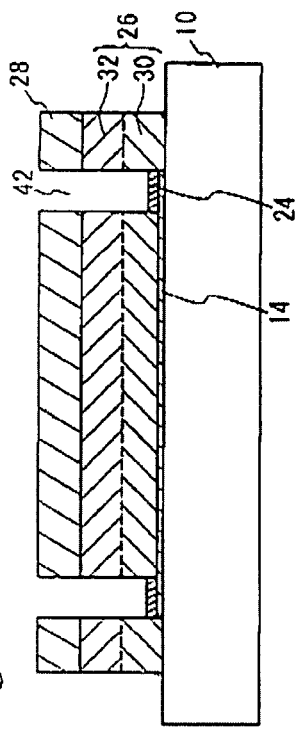
FIGS. 11A through 11F are cross-sectional views showing a further process for fabricating the acoustic wave device in accordance with the first embodiment.
Figure 11B:
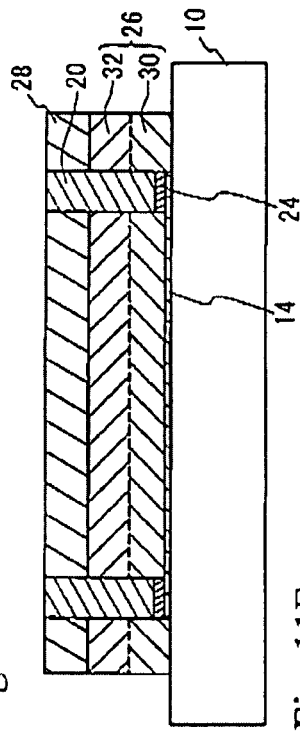
Figure 11C:
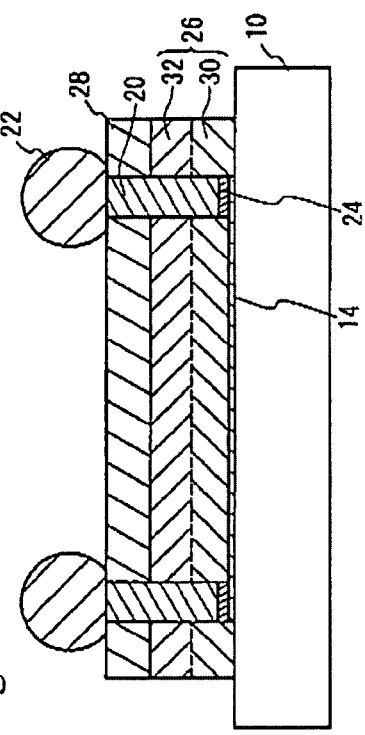
Figure 11D:
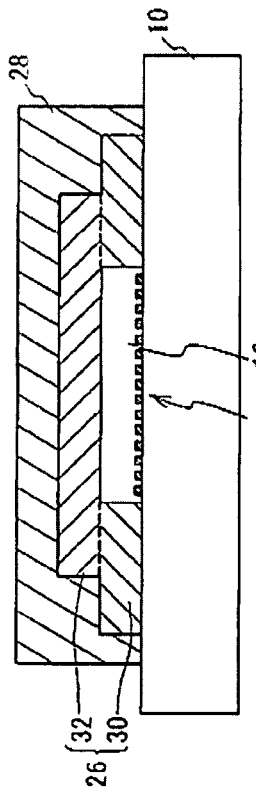
Figure 11E:
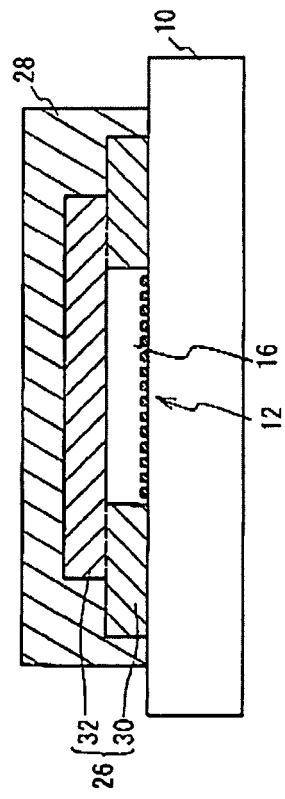
Figure 11F:
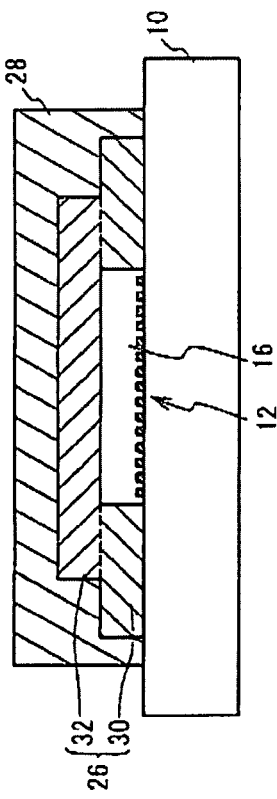

Referring to FIGS. 11A and 11D, the wafer is developed and the third resin film 35 is thus removed from the areas onto which the ultraviolet light is not projected. Thus, the second seal portion 28 is defined on the first seal portion 26. The wafer is heat-treated in a nitrogen atmosphere for one hour at 200° C., so that the second seal portion 28 can be cured. The second seal portion 28 has the openings 42 located above the electrode pad 24. The second seal portion 28 is not provided in the peripheral area. Referring to FIGS. 11B and 11E, electroless plating of Ni (nickel), Cu or Au (gold) is applied to the openings 42, so that the electrically conductive through electrodes 20 can be formed in the opening 42. The through electrodes 20 may be formed by filling the openings 42 with an electrically conductive material such as silver paste by printing. Referring to FIGS. 11C and 11F, the solder balls 22 connected to the through electrodes 20 are provided thereon by mounting SnAg solder balls. The solder balls 22 may also be formed by mask-printing and reflowing SnAg solder paste. Thus, the through electrodes 20 and the solder balls 22 electrically connected to the acoustic wave element 12 are completed. After that, the wafer is cut in peripheral areas of the respective piezoelectric substrates 10 by dicing. Thus, the acoustic wave devices of the first embodiment are completed.

According to the first embodiment, as shown in FIG. 7B, the first seal portion 26 has the step in which the width t2 of the lower portion closer to the piezoelectric substrate 10 is greater than the width t3 of the upper portion. Thus, even if the pattern of the fourth seal portion 32 deviates from that of the third seal portion 30 in the wafer peripheral portion due to a wafer warp of the piezoelectric substrate 10, this deviation does not cause the region B of the third comparative example shown in FIG. 5 in which the fourth seal portion 32 is overhanged. Thus, in the laminate of the first seal portion 26 and the second seal portion 28, the second seal portion 28 and the piezoelectric substrate 10 of the first embodiment have an increased contact area in the wafer periphery, as compared to the third comparative example. The increased contact area improves the adhesiveness of the second seal portion 28 and suppress removal thereof. Thus, the first embodiment has a better yield than the third comparative example. Since the second seal portion 28 is stacked on the first seal portion 26, it is possible to prevent the ceiling portion of the first seal portion 26 and the second seal portion 28 located above the functional portion of the acoustic wave element 12 from being concaved due to pressure applied during modularizing.

As shown in FIG. 7B, the first seal portion 26 has the third seal portion 30 provided on the piezoelectric substrate 10 so as to surround the functional portion of the acoustic wave element 12, and the fourth seal portion 32 provided on the third seal portion 30 so as to define the cavity 16 above the functional portion of the acoustic wave element 12. The width of the third seal portion 30 is greater than that of the fourth seal portion 32, so that the third seal portion 30 and the fourth seal portions 32 form the step. It is thus possible to easily form the first seal portion 26 having a step formed so that the width t2 of the lower portion of the first seal portion 26 closer to the piezoelectric substrate 10 is greater than the width t3 of the upper portion thereof.

As shown in FIG. 7B, the width t4 of the contact area between the third seal portion 30 and the fourth seal portion 32 is equal to or greater than 40 μm. Thus, even if the pattern of the fourth seal portion 32 deviates from the pattern of the third seal portion 30 due to the wafer warp, it is possible to secure the sufficiently great width t4 of the contact area between the first seal portion 30 and the fourth seal portion 32. It is thus possible to prevent the developer used in the step of forming the fourth seal portion 32 from entering into the cavity 16 through the interface between the third seal portion 30 and the fourth seal portion 32. The width t2 of the third seal portion 30 that does not contact the fourth seal portion 32 is equal to or less than 30 μm. In terms of downsizing of the acoustic wave device, the width t5 of the third seal portion 30 that does not contact the fourth seal portion 32 is preferably equal to less than 30 μm.

As shown in FIGS. 7A and 7C, the first seal portion 26 composed of the third seal portion 30 and the fourth seal portion 32 is formed in areas other than the area in which the cavity 16 is to be formed above the functional portion of the acoustic wave element 12. For example, the first seal portion 26 is provided in the peripheral areas of the through electrodes 20. However, the first seal portions 26 may not be provided in the peripheral areas of the through electrodes 20. It is thus possible to reduce the area on the piezoelectric substrate 10 occupied by the first seal portion 26 and to restrain compressive stress generated in the first seal portion 26 due to thermal treatment of the first seal portion 26. So that the wafer warp can be reduced. For similar reasons, only the third seal portion 30 is provided in the peripheral areas of the through electrodes 20, and the fourth seal portion 32 is not provided.

Figure 12:
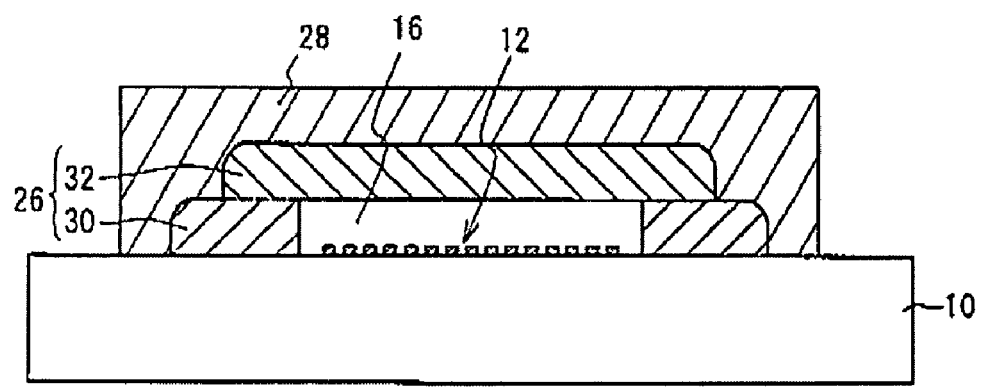
FIG. 12 is a diagram showing a rounded shape.

As shown in FIG. 7B, the step of the first seal portion 26 is like stairs, that is, the side and top surfaces of the third seal portion 30 and the side and top surfaces of the fourth seal portions 32 are respectively flat surfaces. The step is not limited to the stairs-like shape, but may have another shape. An exemplary shape of the step is illustrated in FIG. 12 in which at least one of the corners of the side and top surfaces of the third seal portion 30 and the corners of the side and top surfaces of the fourth seal portion 32 is rounded to have a round shape. The arrangement shown in FIG. 12 improves the yield and prevents the ceiling portion of the first seal portion 26 and the second seal portion 28 located above the functional portion of the acoustic wave element 12 from being concaved due to pressure applied during modularizing.

Further, as shown in FIG. 7B, the surface of the third seal portion 30 and the side surface of the fourth seal portion 32 form the angle θ2 of 90 degrees. The angle θ2 may be an acute angle or an obtuse angle. However, an excessively obtuse angle θ2 may cause an overhang region, and makes it difficult to form the second seal portion 28. This may degrade the adhesiveness of the second seal portion 28 and may cause removal thereof. Thus, the angle θ2 is preferably 90 degrees, an acute angle or a slightly obtuse angle.

Furthermore, as shown in FIG. 7B, the angle θ1 formed by the surface of the piezoelectric substrate 10 and the side surface of the third seal portion 30 is 90 degrees. However, the angle θ1 may be an acute angle. Even for the acute angle, the first seal portion 26 does not form an overhang portion, so that the contact area between the second seal portion 28 and the piezoelectric substrate 10 can be increased. Thus, the adhesiveness of the second seal portion 28 can be improved and the yield can be improved.

Figure 13:
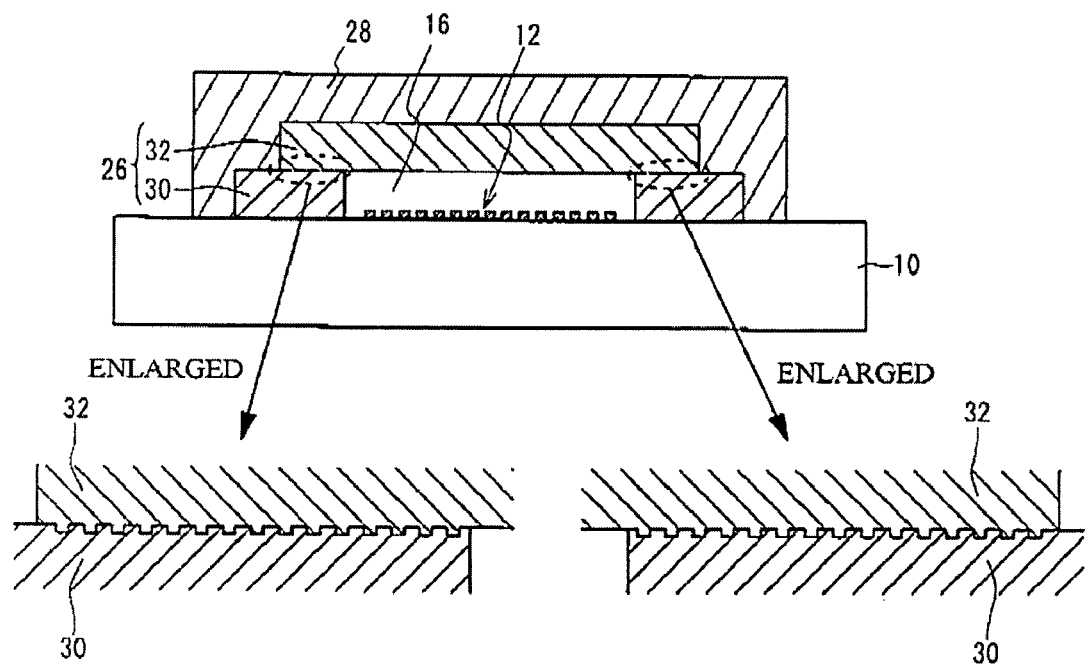
FIG. 13 is a diagram showing that contact surfaces of third and fourth seal portions have a roughness.

As shown in FIG. 7B, the third seal portion 30 has the flat surface that contacts the fourth seal portion 32. Alternatively, as shown in FIG. 13, the surface of the third seal portion 30 may have a roughness. This roughness increases the contact area between the third seal portion 30 and the fourth seal portion 32, and improves the adhesiveness therebetween. The roughness may be formed by exposing and developing the third seal portion 30 with a mask that has desired concavity and convexity.

As shown in FIG. 7B, the first seal portion 26 has the single step defined by the third seal portion 30 and the fourth seal portion 32. Alternatively, the first seal portion 26 may have multiple steps like stairs. This alternative is capable of preventing the second seal portion 28 from being removed and improving the yield.

The first embodiment employs photosensitive epoxy resin for the first seal portion 26 and the second seal portion 28. Another material may be used as long as the functional portions of the acoustic wave elements 12 can be protected. It is to be noted that photosensitive resin such as photosensitive polyimide resin is preferably used because the first seal portion 26 having the step and the second seal portion 28 provided thereon can easily be formed.

In the first embodiment, the acoustic wave elements 12 are surface acoustic wave (SAW) elements formed on the piezoelectric substrate 10. The acoustic wave elements 12 may be a SAW element formed by a piezoelectric film provided on a substrate such as a silicon substrate. The acoustic wave elements 12 may be of FBAR type. In the FBAR elements, the substrate is not a piezoelectric substrate but may be a silicon substrate, glass substrate, or sapphire substrate, and FBAR is formed by a piezoelectric film supported by the substrate.

In the first embodiment, the acoustic wave device has two acoustic wave elements 12 and two cavities 16. However, the acoustic wave device of the present invention may have an arbitrary number of acoustic wave elements 12 and an arbitrary number of cavities 16. The first embodiment employs the terminals formed by the through electrodes 20 and the solder balls 22. The terminals are not limited to the above but may be any terminals capable of malting electric connections with the outside in surface mounting. For example, the terminals may be bumps formed by a metal such as Au or Cu.

The present invention is not limited to the specifically disclosed embodiments, but may include other embodiments and variations within the scope of the present invention.

The present application is based on Japanese Patent Application No. 2007-012100 filed Jan. 23, 2007, the entire disclosure of which is hereby incorporated by reference.

What is claimed is:

1. An acoustic wave device comprising:
   an acoustic wave element formed on a substrate;
   a first seal portion provided on the substrate so as to form a cavity above the acoustic wave element; and
   a second seal portion provided on the first seal portion,
   the first seal portion having a step so that the first seal portion has a width on a first side and another width on a second side arranged so that the first side is closer than the second side to the substrate, and the width on the first side is greater than the another width on the second side,
   wherein the step has a rounded corner portion.

2. The acoustic wave device as claimed in claim 1, wherein the step has a stair shape.

3. The acoustic wave device as claimed in claim 1, wherein:
   the first seal portion has a third seal portion provided on the substrate so as to surround a functional portion of the acoustic wave device, and a fourth seal portion provided on the third seal portion so as to form the cavity above the functional portion; and
   the third seal portion is wider than the fourth seal portion.

4. An acoustic wave device comprising:
   an acoustic wave element formed on a substrate:
   a first seal portion provided on the substrate so as to form a cavity above the acoustic wave element; and
   a second portion provided on the first seal portion,
   the first seal portion having a step so that the first seal portion has a width on a first side and another width on a second side arranged so that the first side is closer than the second side to the substrate, and the width on the first side is greater than the another width on the second side,
   wherein:
   the first seal portion has a third seal portion provided on the substrate so as to surround a functional portion of the acoustic wave device, and a fourth seal portion provided on the third seal portion so as to form the cavity above the functional portion;
   the third seal portion is wider than the fourth seal portion; and a surface of the third seal portion on which the fourth seal portion and a side surface of the fourth seal portion form an acute angle.

5. An acoustic wave device comprising:

an acoustic wave element formed on a substrate;

a first seal portion provided on the substrate so as to form a cavity above the acoustic wave element; and a second seal portion provided on the first seal portion, the first seal portion having a step so that the first seal portion has a width on a first side and another width on a second side arranged so that the first side is closer than the second side to the substrate, and the width on the first side is greater than the another width on the second side, wherein;

the first seal portion has a third seal portion provided on the substrate so as to surround a functional portion of the acoustic wave device, and a fourth seal portion provided on the third seal portion so as to form the cavity above the functional portion;

the third seal portion is wider than the fourth seal portion; and a surface of the third seal portion on which the fourth seal portion and a side surface of the fourth seal portion form an obtuse angle.

6. An acoustic wave device comprising:

an acoustic wave element formed on a substrate;

a first seal portion provided on the substrate so as to form a cavity above the acoustic wave element; and a second seal portion provided on the first seal portion, the first seal portion having a step so that the first seal portion has a width on a first side and another width on a second side arranged so that the first side is closer than the second side to the substrate, and the width on the first side is greater than the another width on the second side, wherein;

the first seal portion has a third seal portion provided on the substrate so as to surround a functional portion of the acoustic wave device, and a fourth seal portion provided on the third seal portion so as to form the cavity above the functional portion;

the third seal portion is wider than the fourth seal portion; and a surface of the substrate on which the first seal portion is provided and a side surface of the third seal portion form an acute angle.

7. The acoustic wave device as claimed in claim 3, wherein the third seal portion has a flat surface that contacts the fourth seal portion.

8. The acoustic wave device as claimed in claim 3, wherein the third seal portion has a rough surface that contacts the fourth seal portion.

9. The acoustic wave device as claimed in claim 1, wherein the first and second seal portions are formed by photosensitive resin.

* * * * *